United States Patent [19]
Pan et al.

[11] Patent Number: 5,629,884
[45] Date of Patent: May 13, 1997

[54] LOG CONVERTER UTILIZING OFFSET AND METHOD OF USE THEREOF

[75] Inventors: Shao W. Pan, Schaumburg; Shay-Ping T. Wang, Long Grove, both of Ill.

[73] Assignee: Motorola, Inc., Schaumburg, Ill.

[21] Appl. No.: 508,365

[22] Filed: Jul. 28, 1995

[51] Int. Cl.$^6$ .............................. G06F 7/00; G06F 15/00; G06F 1/02; H03M 7/50
[52] U.S. Cl. .................... 364/748.5; 364/722; 341/75
[58] Field of Search .................... 364/748.5, 715.03, 364/722, 735, 736; 341/75

[56] References Cited

U.S. PATENT DOCUMENTS

| | | | |
|---|---|---|---|
| 4,626,825 | 12/1986 | Burleson et al. | 340/347 |
| 4,682,152 | 7/1987 | Okamoto et al. | 364/722 |
| 5,184,317 | 2/1993 | Pickett | 364/735 |
| 5,343,254 | 8/1994 | Wada et al. | 348/627 |
| 5,359,551 | 10/1994 | Pickett | 364/718 |

FOREIGN PATENT DOCUMENTS

| | | | |
|---|---|---|---|
| 59-218550 | 12/1984 | Japan. | |
| 0218550 | 12/1987 | Japan. | |
| WO93/17383 | 9/1993 | WIPO | G06F 7/52 |

OTHER PUBLICATIONS

"The Efficient Implementation and Analysis of a Hybrid Number System Processor" by Fang-shi Lai, IEEE Transactions on Circuits and Systems–II: Analog and Digital Signal Processing, vol. 40, No. 6, Jun. 1993.

A Logarithmic Vector Processor for Neural Net Applications by Steve Richfield, Neurosoft, IEEE First International Conference on Neural Networks, Sheraton Harbor Island East, San Diego, California, Jun. 21–24, 1987.

A Multiplier–Less Digital Neural Network by L. Spaaneburg, B. Hoefflinger, S. Neusser, J.A.G. Nijhuis, A. Siggelkow, IMS, Stuttgart, Germany, Proceedings of the 2nd Int'l Conference on Microelectronics for Neural Networks, Oct. 16–18, 1991, Munich, F.R. Germany.

Algorithm Design for a 30 bit Integrated Logarithmic Processor by David M. Lewis and Lawrence K. Yu, Department of Electrical Engineering, University of Toronto, Proceeding 9th Symposium on Computer Arithmetic, 1989, IEEE Comp. Soc. Press, pp. 192–199.

An Architecture for Addition and Subtraction of Long Word Length Numbers in the Logarithmic Number System by David M. Lewis, Member, IEEE, IEEE Transactions on Computers, vol. 39, No. 11. Nov. 1990, pp. 1325–1336.

A 30–b Integrated Logarithmic Number System Processor by Lawrence K. Yu, Member, IEEE, and David M. Lewis, Member, IEEE, IEEE Journal of Solid–State Circuits, vol. 26, No. 10, Oct. 1991, pp. 1433–1440.

An Accurate LNS Arithmetic Unit Using Interleaved Memory Function Interpolator by David M. Lewis, Department of Electrical Engineering, University of Toronto, Proceeding 11th Symposium on Computer Arithmetic, 1993, IEEE Comp. Soc. Press, pp. 2–9.

(List continued on next page.)

Primary Examiner—Paul P. Gordon
Assistant Examiner—Emmanuel L. Moise
Attorney, Agent, or Firm—Michael K. Lindsey

[57] ABSTRACT

A digital log converter is provided which includes a comparator (10) and a log signal generator (20). Upon receiving a digital input signal (12), the comparator (10) determines whether an upper bit-slice of the input signal (12) equals zero. If the upper bit-slice is zero, the log signal generator (20) subtracts an offset from at least one parameter to generate a log signal (16); otherwise, the log signal generator (20) interpolates the at least one parameter and a lower bit-slice of the input signal (12) to generate the log signal (16).

14 Claims, 2 Drawing Sheets

OTHER PUBLICATIONS

Interleaved Memory Function Interpolators with Application to an Accurate LNS Arithmetic Unit by David M. Lewis, Member, IEEE, IEEE Transactions on Computers, vol. 43, No. 8, Aug. 1994, pp. 974–982.

Table–Lookup Algorithms for Elementary Functions and Their Error Analysis by Ping Tak Peter Tang, Matematics and Computer Schience Division, Argonne National Laboratory, 9700 S. Cass Ave., Argonne, IL 60439–4801, Proceeding 10th Symposium on Computer Arithmetic, Jun. 1991, pp. 232–236.

Applying Features of IEEE 754 to Sign/Logarithm Arithmetic by Mark G. Arnold, Member, IEEE, Thomas A. Bailey, Member, IEEE, John R. Cowles, and Mark D. Winkel, IEEE Transactions on Computers, vol. 41, No. 8, Aug. 1992, pp. 1040–1050.

D8.13 Improved Accuracy for Logarithmic Addition in DSP Applications by Mark G. Arnold, John Cowles, and Thomas Bailey, Computer Science Department, University of Wyoming, Laramie, WY, ICASSP 88: Int. Conf. on Acoustics, Speech and Signal Processing, vol. 3 pp. 1714–1717.

Redundant Logarithmic Number Systems by M.G. Arnold, T.A. Bailey, J.R. Cowles, J.J. Cupal, University of Wyoming, Laramie, WY, Proceeding of 9th Symposium on Computer Arithmetic, pp. 144–151, IEEE Comp. Soc. Press.

Comments on "An Architecture for Addition and Subtraction of Long Word Length Numbers in the Logarithmic Number System"[1] by M. Arnold, T. Bailey and J. Cowles, IEEE Transactions on Computers, vol. 41, No. 6, Jun. 1992, pp. 786–788.

Redundant Logarithmic Arithmetic, Mark G. Arnold, Member IEEE, Thomas A. Bailey, Member IEEE, John R. Cowles, and Jerry J. Cupal, Members IEEE, IEEE Transactions on Computers, vol. 39, No. 8, Aug. 1990, pp. 1077–1086.

A10–ns Hybrid Number Ssytem Data Execution Unit for Digital Signal Processing Systems, Fang–shi Lai, Member IEEE, IEEE Journal of Solid–State Circuits, vol. 26, No. 4, Apr. 1991.

A Hybrid Number System Processor with Geometric and complex Arithmetic Capabilities, Fang–shi Lai, Member IEEE, Ching–Farn Eric Wu, Member IEEE, IEEE Transactions on Computers, vol. 40, No. 8, Aug. 1991.

5,629,884

LOG CONVERTER UTILIZING OFFSET AND METHOD OF USE THEREOF

TECHNICAL FIELD

The present invention relates generally to logarithmic conversion of numeric values and, in particular, to a circuit for performing log conversion of a numeric value represented by a signal.

BACKGROUND OF THE INVENTION

Logarithmic converters are used to implement logarithmic functions and are most commonly found in items such as hand-held calculators and spread sheet software programs. Logarithmic functions, or log functions, belong to a class of mathematical functions called transcendental functions which are important in wide variety of applications such as data communications, control systems, chemical processes, and computer simulation. A log function is abbreviated with the following mathematical equation: $y=\log_b(X)$. In this equation, x represents an input value which may be any number greater than or equal to zero; b represents a base number system; and y represents a logarithm value, or log value, which corresponds to the input value x.

Inverse-log converters are used to implement inverse-logarithmic, or inverse-log, functions. Essentially, an inverse-log function is the reverse of a log function. What is meant by "reverse" is explained in the following discussion. A log function converts an input value, x, which is in a domain of input values into a definite log value which is in a range of log values. Basically, the log function establishes a one-to-one correspondence between input values in the domain and log values in the range. This correspondence is represented symbolically by x→y. An inverse-log function establishes a reverse correspondence between log values and input values which is represented by y→x. An inverse-log function is abbreviated with either of the following equivalent mathematical equations: $y=\log_b^{-1}(x)$ Or $y=b^x$. In these equations, x represents an input value; b represents a base number system; and y represents an inverse-log value which corresponds to the input value x and may be any number greater than or equal to zero. Like log functions, inverse-log functions are important in a wide variety of applications.

Two techniques of computing log and inverse-log values are commonly used today. Both techniques are analogously used to compute either log or inverse-log values; thus, for the sake of brevity, the following discussion will focus on using the techniques to compute log values, with the understanding that the techniques may be used in a like manner to compute inverse-log values.

The first technique involves storing a corresponding log value in a look-up table for every possible input value to a converter. This approach allows a log value to be computed relatively quickly and is practical for applications requiring limited precision and having input values within a small domain. However, in many applications this technique is impractical because it requires too great a memory space to store the look-up table. For example, in a digital system using an IEEE standard 32-bit floating point number, which has a 23-bit mantissa, such a look-up table would be required to store up to $2^{23}$ log values—one for every possible mantissa value. A computer memory for storing this number of log values would be prohibitively expensive, if not impossible, to build.

The second technique of computing log values involves computing a power series to approximate a log function. An example of a power series which approximates a log function is given as:

$$y=\text{Log }(1+x)=x-x^2/2+x^3/3-x^4/4+ \quad \text{Equation}$$

In this example, Equation 1 approximates a specific type of log function known as a natural logarithm, which is widely used in science and engineering applications. The variables in Equation 1 are defined as follows: y represents a log value, and x represents an input value in the domain $-1 \leq x < 1$. Although the technique of using a power series to approximate a log function allows a log value to be computed with a high degree of precision, it requires a large number of computer operations and therefore requires a relatively long period of time to execute. In other words, this technique is generally slow and negatively affects the throughput of a computer.

In summary, there is a need for a converter which can perform either a log or an inverse-log function quickly, thus allowing a computer to operate with greater throughput. Such a converter should also reduce the amount of memory space required to perform the conversions, and it should produce log or inverse-log values which have a high degree of precision.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF A PREFFERED EMBODIMENTS

An advantage of the present invention is that it provides a log converter which computes log values with a high degree of precision. A further advantage of the present invention is that it provides a converter which uses significantly less memory space and may be efficiently implemented in an integrated circuit which consumes little power. It is also an advantage of the present invention to provide a method of using a converter to produce a log signal.

Figure 1:
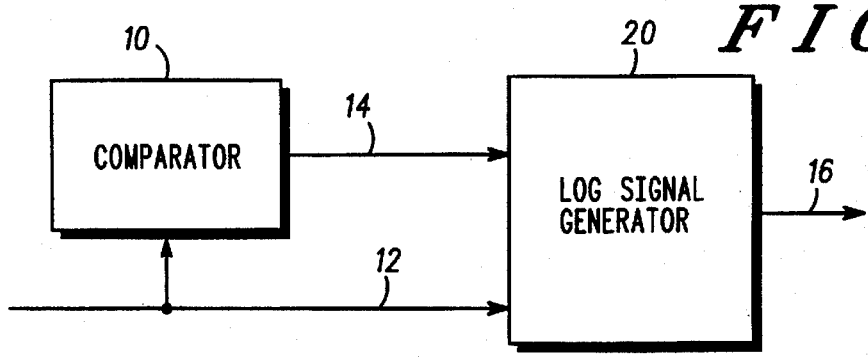
FIG. 1 illustrates a block diagram of a log converter in accordance with one embodiment of the present invention.

FIG. 1 illustrates a block diagram of a log converter in accordance with one embodiment of the present invention. The log converter includes a comparator 10 and a log signal generator 20. An input signal 12 is distributed to the comparator 10 and the log signal generator 20. The input signal 12 is an electrical signal, either analog or digital, that represents a numeric value within a domain of possible inputs. The comparator 10 determines whether the input signal is within a predetermined sub-domain. A sub-domain is a subset of numeric values from the domain. As a result of performing such a determination, the comparator 10 generates a respectively valued Boolean signal 14 which is received by the log signal generator 20. If the input signal is within the sub-domain, the log signal generator 20 subtracts an offset from at least one parameter to generate a log signal 16; otherwise, the log signal generator 20 interpolates the at least one parameter and the input signal 12 to generate the log signal 16. The offset is a pre-determined numeric value that can be represented by an electrical signal, while the at least one parameter is one or more pre-determined numeric values that are useful in computing the log signal. The parameters can be construed as either digital or analog signals.

The comparator 10 can be any means for determining whether the input signal is within the predetermined sub-domain, and it can encompass any digital or analog comparator capable of performing such function. For example, the comparator 10 could include a NOR logic gate having an input for each bit in a digital word which represents the input signal, or any combination of logic gates performing a like function. In addition, the comparator 10 could use any combination of positive or negative logic.

The log signal generator 20 can be any device for selectively performing interpolation or subtracting the offset, according to the Boolean signal 14. For example, the log signal generator 20 could be a microprocessor executing a specific sequence of operational steps in a software routine, or an analog or digital ASIC (application specific integrated circuit). The log signal generator 20 can perform any nth-order interpolation to approximate a log function having a base m, where n is an integer, and m is a positive number. Consequently, various embodiments of the log signal generator 20 can approximate a log function by computing a linear interpolation, $2^{nd}$-order interpolation, $3^{rd}$-order interpolation, etc.

Figure 2:
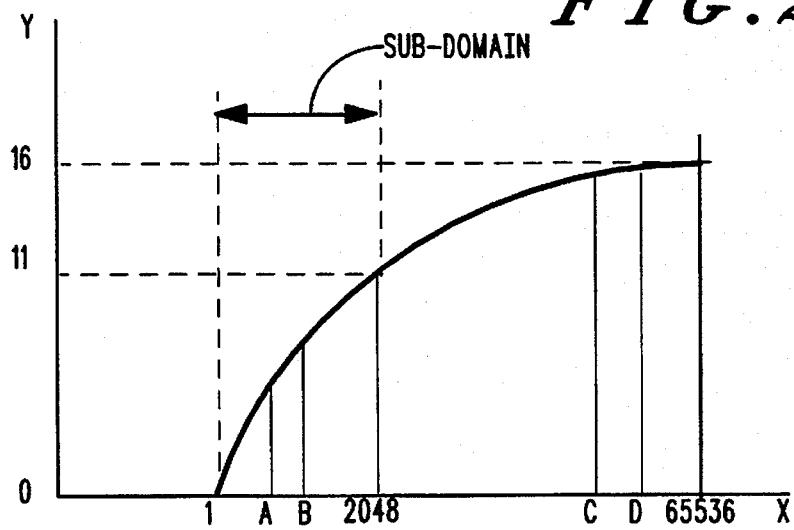
FIG. 2 illustrates a graph of a logarithmic function.

FIG. 2 shows a graph of a logarithmic function over a domain of input signals. The input signals are given along the x-axis and the log signals are given along the y-axis. In the example shown, the log function uses a base number system of two; the domain of the input signals is 1 to 65536; the sub-domain is 1 to 2048; and the range of the log signals is 0 to 16. The base, domain, sub-domain, and range shown in FIG. 2 are those used by a preferred embodiment of the present invention.

To better illustrate the general operation of a log converter which conforms to an embodiment of the present invention, two example intervals are indicated with vertical lines at base points a-b and c-d. The base points of these intervals are equally spaced. One of ordinary skill in the art will realize that the derivative of the log function within the a-b interval will be greater than that of the c-d interval. Thus, interpolating between equally spaced base points in the a-b interval will inherently produce less accurate results than like interpolation in the c-d interval. To overcome this problem, the log converter essentially uses look-up table to generate log value of inputs within the sub-domain and interpolation to generate log values of all other inputs within the domain.

Figure 3:
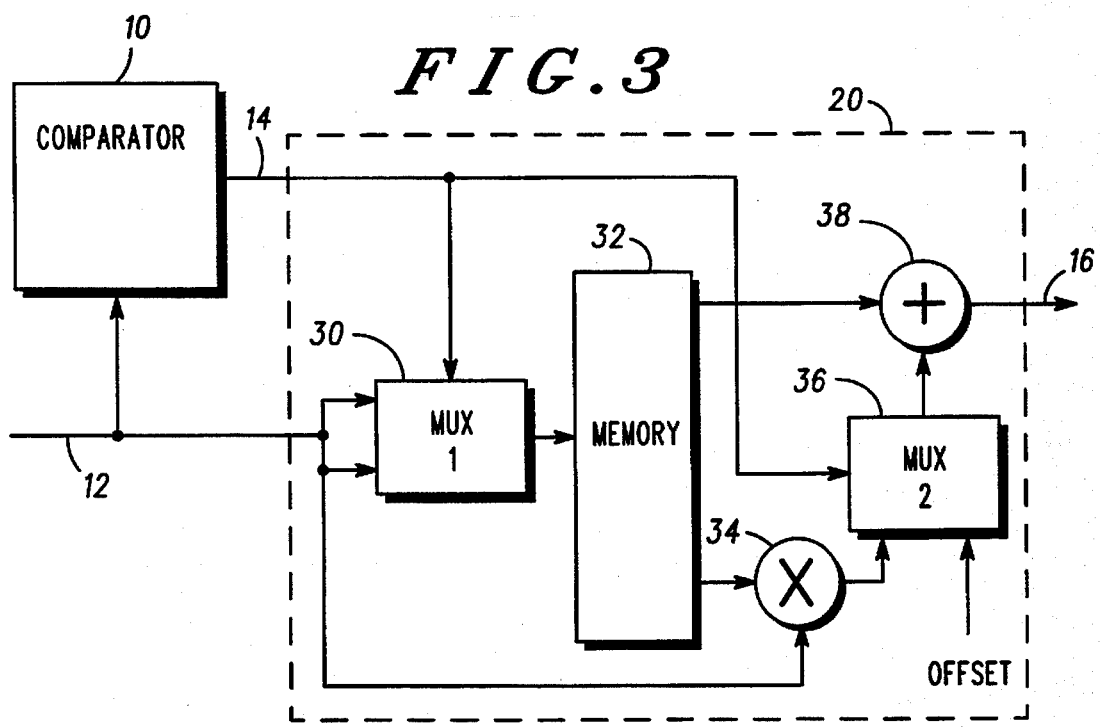
FIG. 3 illustrates a detailed block diagram of the log converter of FIG. 1 in accordance with another embodiment of the present invention.

FIG. 3 illustrates a detailed block diagram of the log converter of FIG. 1 in accordance with another embodiment of the present invention. The log converter includes the comparator 10 and the log signal generator 20. In a preferred embodiment of the present invention, the log signal generator 20 includes a first multiplexer 30, a memory 32, a multiplier 34, a second multiplexer 36, and an adder 38. The preferred version of the log signal generator 20 selectively performs linear interpolation involving the input signal 12 and parameters stored in the memory 32.

The linear interpolation is based on the following equation:

$$y=ax+b \qquad \text{Equation (1)}$$

where y represents a log signal 16, x represents the input signal 12, a represent a first parameter, and b represents a second parameter.

Although a log converter embodying the present invention can compute log signals of any bit-size or precision, in accordance with a preferred embodiment, the log converter computes 16-bit log signals corresponding to 16-bit input signals. The input signal 12 is a digital word which comprises an upper bit-slice and a lower bit-slice. The upper bit-slice includes the five most significant bits of the input signal 12, while the lower bit-slice includes the five least significant bits thereof. The comparator 10 includes a comparator for determining whether the upper bit-slice of the input signal 12 equals zero. If so, the Boolean signal 14 is set to true; if not, the Boolean signal 14 is set to false.

The first multiplexer 30 selects an address which is based on the input signal 12. If the Boolean signal 14 is true, the first multiplexer 30 selects the address to include bits of the input signal 12 which are less significant than the upper bit-slice. If the Boolean signal 14 if false, the first multiplexer 30 selects the address to include bits of the input signal 12 which are more significant than the lower bit-slice.

The memory 32 provides the first parameter and the second parameter corresponding to the address. The memory 32 stores a plurality of first and second parameters as parameter pairs. Each address indicates a different parameter pair. The first parameter represents a linear coefficient used to interpolate the input signal 12. The second parameter represents a summation of the offset and log of a numeric value represented by the bits of the input signal 12 which are less significant than the upper bit-slice. The at least one parameter mentioned in reference to the log converter of FIG. 1 can be construed as including the parameter pairs.

The precision of the log signal 16 is based on the number of bits in the first parameter and the second parameter. In a preferred embodiment of the present invention, the first parameter is six bits in length and the second parameter is 17 bits.

The multiplier 34 multiplies the first parameter by the lower bit-slice of the input signal to produce a product. The second multiplexer 36 selects either the product or a negative offset as a second multiplexer (mux) output, according to the Boolean signal 14. If the Boolean signal 14 is true, the second multiplexer 36 selects the product; otherwise, the second multiplexer 36 selects the negative offset. The negative offset is the two's-complement of the offset. Preferably, the value of the offset is five.

The adder 38 sums the second parameter and the mux output to generate the log signal 16.

In another embodiment of the present invention, the upper and lower bit-slices are six bits in length and the offset has a value of six. This embodiment allows a smaller memory than the preferred embodiment, but provides less precision in the log signal.

Figure 4:
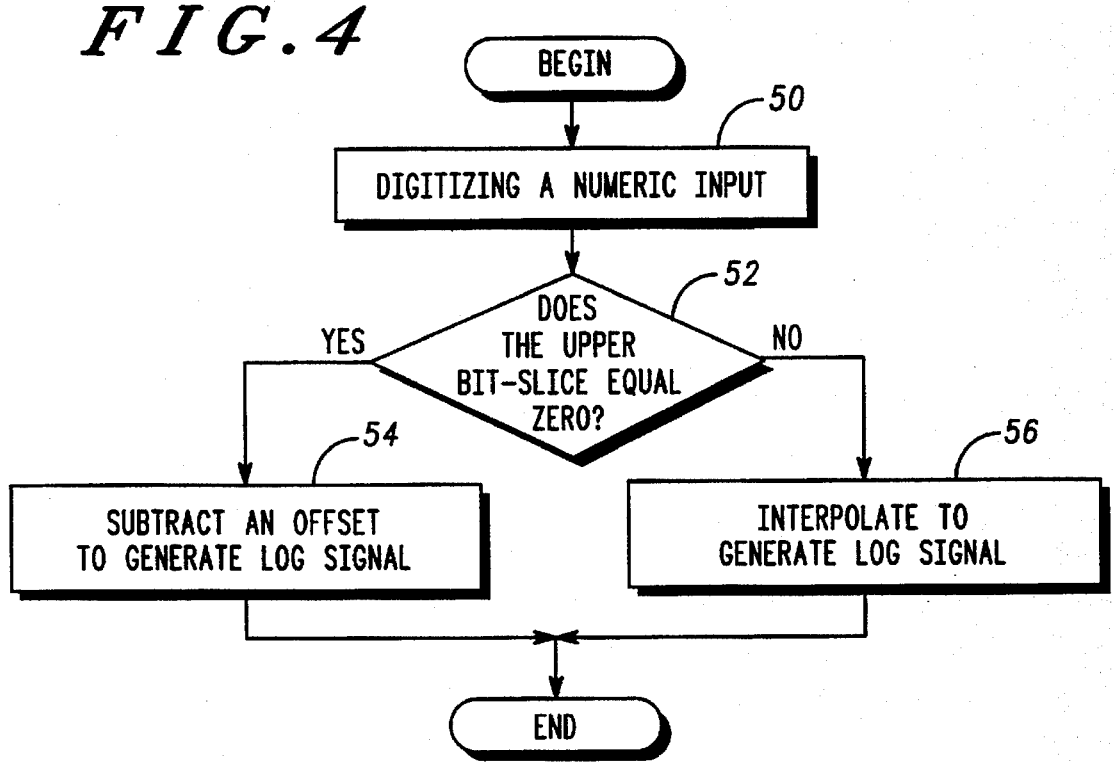
FIG. 4 illustrates a flow diagram of a method of using the log converters shown in FIGS. 1 and 3.

FIG. 4 illustrates a flow diagram of a method of using the log converters shown in FIGS. 1 and 3 to generate the log signal 16. Generally, a determination is made whether the input signal 12 is within a sub-domain. If so, the offset is added (a negative offset) to at least one parameter to generate the log signal 16. If not, interpolation is performed with the at least one parameter and the input signal 12 to generate the log signal 16.

In box 50, a numeric input is digitized by representing the numeric value with an input signal 12 having an upper bit-slice and a lower bit-slice. In decision box 52, a check is made whether the upper bit-slice equals zero. If so, the method proceeds to box 54. If not, the method proceeds to box 56. In box 54, an offset is subtracted from at least one parameter to generate the log signal 16. In box 56, interpolation is performed, preferably linear interpolation, with the at least one parameter and the lower bit-slice to generate the log signal 16.

The log converter may also require one or more parameters to first be stored in the memory 32. In such case, the parameters are retrieved as follows. If the upper bit-slice equals zero, at least one parameter from a memory location corresponding to bits of the input signal 12 which are less significant than the upper bit-slice is retrieved; otherwise, at least one parameter from a memory location corresponding to bits of the input signal which are more significant than the lower bit-slice is retrieved.

Figure 5:
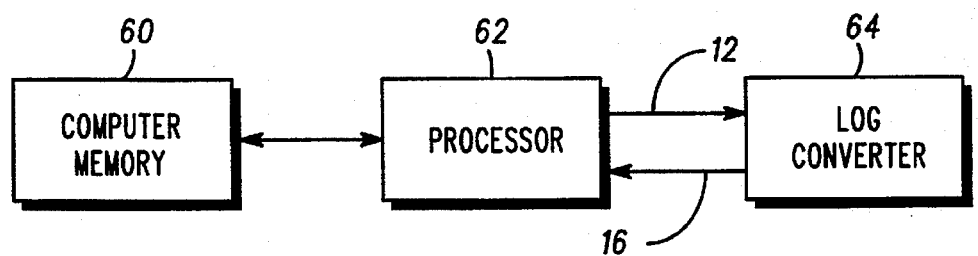
FIG. 5 illustrates a computer which incorporates an embodiment of the present invention.

FIG. 5 illustrates one version of a computer which incorporates an embodiment of the present invention. The computer comprises a processor 62 for executing a computer operation which utilizes the log signal 16; a computer memory 60 for storing a computer program which includes the computer operation; and a log converter 64 which generates the log signal 16 in response to the input signal 12. The log converter 64 can include either of the log converters depicted in FIGS. 1 and 2.

Figure 6:
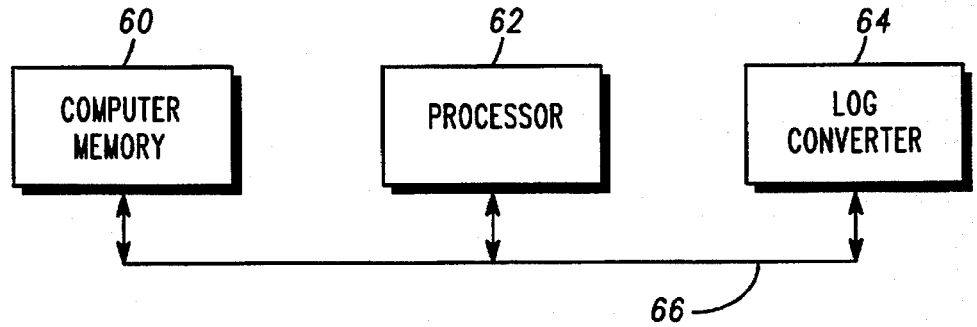
FIG. 6 illustrates another computer which incorporates an embodiment of the present invention.

FIG. 6 illustrates another version of a computer which incorporates an embodiment of the present invention. The computer comprises the processor 62, the computer memory 60, the log converter 64, and a common bus 66 for transferring data between the processor 62, the computer memory 60, or the log converter 64. The data can include the input signal, log signal, and program instructions.

Thus there has been described herein a concept, as well as a preferred embodiment, of a converter which may be used to compute a log signal. Because the embodiment of the converter as herein-described selectively utilizes table-look or interpolation to approximate a log function it can perform a conversion using a single adder, a single multiplier, and a look-up table which allows a significant reduction in memory size. Such a converter allows both improved data throughput and computational precision with a vast reduction in cost of microchip implementation.

While specific embodiments of the present invention have been shown and described, it will be apparent to those skilled in the art that the disclosed invention may be modified in numerous ways and may assume many embodiments other than the preferred form specifically set cut and described above.

Accordingly, it is intended by the appended claims to cover all modifications of the invention which fall within the true spirit and scope of the invention.

What is claimed is:

1. A log converter, which comprises:
   a comparator for determining whether an input signal is within a sub-domain; and
   a log signal generator, operatively coupled to the comparator, for generating a log signal;
   wherein if the input signal is within the sub-domain, the log signal generator subtracts an offset from at least one parameter to generate the log signal, otherwise, the log signal generator interpolates the at least one parameter and the input signal to generate the log signal.

2. The log converter of claim 1, wherein the log signal generator linearly interpolates the at least one parameter and the input signal.

3. The log converter of claim 1, wherein the at least one parameter represents a summation of the offset and log of a numeric value represented by the input signal.

4. The log converter of claim 1, wherein log conversion is based upon a base two log conversion.

5. A log converter, which comprises:
   a comparator for determining whether an upper bit-slice of an input signal equals zero;
   a first multiplexer, operatively coupled to the comparator, for selecting an address;
   a memory for providing a first parameter and a second parameter corresponding to the address;
   a multiplier for multiplying the first parameter by a lower bit-slice of the input signal to produce a product;
   a second multiplexer, operatively coupled to the comparator, for selecting either the product or a negative offset as a mux output; and
   an adder for summing the second parameter and the mux output to generate a log signal;
   wherein if the upper bit-slice equals zero, the first multiplexer selects the address to include bits of the input signal which are less significant than the upper bit-slice and the second multiplexer selects the product, otherwise, the first multiplexer selects the address to include bits of the input signal which are more significant than the lower bit-slice and the second multiplexer selects the negative offset.

6. The log converter of claim 5, wherein the precision of the log signal is based on the number of bits in the first parameter and the second parameter.

7. The log converter of claim 5, wherein the second parameter represents a summation of the offset and log of a numeric value represented by the bits of the input signal which are less significant than the upper bit-slice.

8. The log converter of claim 5, wherein log conversion is based upon a base two log conversion.

9. The log converter of claim 5, wherein the memory stores a plurality of parameter pairs, each of the plurality of parameter pairs corresponding to a different address.

10. A computer, which comprises:
    a computer memory for storing a computer program which uses a log signal;
    a processor for executing the computer program to generate an input signal; and
    a log converter, which comprises:
    a comparator for determining whether the input signal is within a sub-domain; and
    a log signal generator, operatively coupled to the comparator, for generating the log signal;
    wherein if the input signal is within the sub-domain, the log signal generator subtracts an offset from at least one parameter to generate the log signal, otherwise, the log signal generator interpolates the at least one parameter and the input signal to generate the log signal.

11. The log converter of claim 10, wherein the log signal generator linearly interpolates the at least one parameter and the input signal.

12. The log converter of claim 10, wherein the input signal has an upper bit-slice and a lower bit-slice; and wherein the log signal generator includes:
    a first multiplexer, operatively coupled to the comparator, for selecting an address;
    a memory for providing a first parameter and a second parameter corresponding to the address;
    a multiplier for multiplying the first parameter by the lower bit-slice to produce a product;
    a second multiplexer, operatively coupled to the comparator, for selecting either the product or a negative offset as a mux output; and an adder for summing the second parameter and the mux output to generate the log signal;

wherein if the upper bit-slice equals zero, the first multiplexer selects the address to include bits of the input signal which are less significant than the upper bit-slice and the second multiplexer selects the product, otherwise, the first multiplexer selects the address to include bits of the input signal which are more significant than the lower bit-slice and the second multiplexer selects the negative offset.

13. The log converter of claim 12, wherein the second parameter represents a summation of the offset and log of a numeric value represented by the bits of the input signal which are less significant than the upper bit-slice.

14. The log converter of claim 10, wherein log conversion is based upon a base two log conversion.

* * * * *